(12) United States Patent
Takayama et al.

(10) Patent No.: US 9,153,761 B2
(45) Date of Patent: Oct. 6, 2015

(54) THERMALLY-CONDUCTIVE SHEET, LED MOUNTING SUBSTRATE, AND LED MODULE

(71) Applicant: Nitto Denko Corporation, Ibaraki-shi, Osaka (JP)

(72) Inventors: Yoshinari Takayama, Osaka (JP); Takafumi Hida, Osaka (JP); Daisuke Kitagawa, Osaka (JP); Kenichi Tagawa, Osaka (JP); Kunio Nagasaki, Osaka (JP); Ryoichi Matsushima, Osaka (JP); Susumu Kiyohara, Osaka (JP); Toshio Uota, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 14/352,445

(22) PCT Filed: Oct. 3, 2012

(86) PCT No.: PCT/JP2012/006326
§ 371 (c)(1),
(2) Date: Apr. 17, 2014

(87) PCT Pub. No.: WO2013/057889
PCT Pub. Date: Apr. 25, 2013

(65) Prior Publication Data
US 2014/0252404 A1    Sep. 11, 2014

(30) Foreign Application Priority Data
Oct. 19, 2011   (JP) ................................. 2011-229438

(51) Int. Cl.
*B29C 43/02* (2006.01)
*B05D 3/02* (2006.01)
(Continued)

(52) U.S. Cl.
CPC .............. *H01L 33/641* (2013.01); *C08L 33/08* (2013.01); *C08L 33/10* (2013.01); *C09D 127/12* (2013.01);
(Continued)

(58) Field of Classification Search
CPC ........................... H01L 23/433; H01L 23/373
USPC ............ 257/774, 784, 99, E21.158; 438/597, 438/667; 428/323, 325, 329, 98; 427/343, 427/372, 124, 331, 547
See application file for complete search history.

(56) References Cited

U.S. PATENT DOCUMENTS 6,407,922 B1   6/2002  Eckblad et al.
6,517,744 B1   2/2003  Hara et al.
(Continued)

FOREIGN PATENT DOCUMENTS

JP   2000-281995   10/2000
JP   2001-214075    8/2001
(Continued)

OTHER PUBLICATIONS
14352445_JP2005347616A (English Translation).*

*Primary Examiner* — Kimberly Rizkallah
*Assistant Examiner* — Brian Turner
(74) *Attorney, Agent, or Firm* — Hamre, Schumann, Mueller & Larson, P.C.

(57) ABSTRACT

The present invention provides a thermally-conductive sheet excellent in heat dissipation properties. The thermally-conductive sheet includes a polymer matrix and a thermally-conductive filler dispersed in the polymer matrix. The present invention is a thermally-conductive sheet including a polymer matrix and non-spherical particles of a thermally-conductive filler that are dispersed in the polymer matrix. At least a part of the thermally-conductive filler particles are oriented in a thickness direction of the sheet. When a portion of the sheet where the thermally-conductive filler particles have the highest degree of orientation in the thickness direction of the sheet is defined as a center of orientation, and an axis passing through the center of orientation and perpendicular to sheet surfaces is defined as a central axis of orientation, the thermally-conductive sheet has a region where the thermally-conductive filler particles are oriented toward one point on the central axis of orientation and where the degree of orientation of the thermally-conductive filler particles in the thickness direction of the sheet decreases from the center of orientation toward a periphery of the sheet.

9 Claims, 1 Drawing Sheet

(51) Int. Cl.
*H01L 23/48* (2006.01)
*H01L 23/28* (2006.01)
*H01L 33/64* (2010.01)
*H01L 23/373* (2006.01)
*C09K 5/14* (2006.01)
*C08L 33/08* (2006.01)
*C08L 33/10* (2006.01)
*C09D 127/12* (2006.01)

(52) U.S. Cl.
CPC ............. *C09K 5/14* (2013.01); *H01L 23/3737* (2013.01); *C08L 2203/20* (2013.01); *H01L 2224/2929* (2013.01); *H01L 2224/29393* (2013.01); *H01L 2224/29499* (2013.01); *Y10T 428/25* (2015.01)

(56) References Cited

U.S. PATENT DOCUMENTS 7,419,722 B2   9/2008   Ohta et al.

| | | |
|---|---|---|
| 2007/0000642 A1 | 1/2007 | Yamazaki et al. |
| 2007/0001292 A1 | 1/2007 | Ohta et al. |
| 2008/0241488 A1* | 10/2008 | Ohta et al. ............... 428/198 |
| 2009/0068441 A1* | 3/2009 | Swaroop et al. ............ 428/329 |
| 2009/0237886 A1* | 9/2009 | Iwai et al. ................. 361/708 |
| 2010/0219550 A1* | 9/2010 | Yao et al. .................. 264/105 |
| 2011/0316173 A1* | 12/2011 | Patti et al. ................ 257/784 |
| 2012/0230043 A1* | 9/2012 | Kitagawa et al. .......... 362/382 |
| 2012/0236502 A1* | 9/2012 | Yamaguchi et al. ........ 361/704 |

FOREIGN PATENT DOCUMENTS

| | | |
|---|---|---|
| JP | 2005-297456 | 10/2005 |
| JP | 2005-347616 | 12/2005 |
| JP | 2007-012911 | 1/2007 |
| JP | 2007-012912 | 1/2007 |
| JP | 2007-012913 | 1/2007 |
| JP | 2010-254766 | 11/2010 |
| JP | 2011-000824 | 1/2011 |
| JP | 2011-032430 | 2/2011 |
| JP | 2011-174016 | 9/2011 |

* cited by examiner

THERMALLY-CONDUCTIVE SHEET, LED MOUNTING SUBSTRATE, AND LED MODULE

TECHNICAL FIELD

The present invention relates to a thermally-conductive sheet including a polymer matrix and thermally-conductive filler particles dispersed in the polymer matrix. The present invention also relates to a light-emitting diode (LED) mounting substrate using the thermally-conductive sheet, and further relates to an LED module using the LED mounting substrate.

BACKGROUND ART

In recent years, the amount of heat generated in electronic components such as semiconductor devices has been increasing with their increasing density and increasing performance. Therefore, it has become important to efficiently dissipate heat generated in electronic components to the outside. Also, in recent years, light-emitting diode (LED) light sources have been actively developed by virtue of the feature of having long life and low power consumption. The amount of heat generated in LEDs has been increasing with their increasing emission intensity. Therefore, it has become important to efficiently dissipate heat generated in LEDs to the outside.

Under such circumstances, heat-dissipating members have been growing in importance. A thermally-conductive sheet including a polymer matrix and thermally-conductive filler particles dispersed in the polymer matrix is known as one type of heat-dissipating members. In such a thermally-conductive sheet, its thermal conduction properties are enhanced by the thermally-conductive filler particles being oriented by magnetic field application or the like (see Patent Literature 1 to 4, for example).

CITATION LIST

Patent Literature

Patent Literature 1: JP 2000-281995 A
Patent Literature 2: JP 2007-012911 A
Patent Literature 3: JP 2007-012912 A
Patent Literature 4: JP 2007-012913 A

SUMMARY OF INVENTION

Technical Problem

In these Patent Literature, thermally-conductive filler particles are oriented along the thickness direction of the sheet. As a result of a study by the present inventors, it has been found that there is room for improvement in heat dissipation properties.

Therefore, the present invention aims to provide a thermally-conductive sheet excellent in heat dissipation properties, the thermally-conductive sheet including a polymer matrix and thermally-conductive filler particles dispersed in the polymer matrix. The present invention also aims to provide an LED mounting substrate using the thermally-conductive sheet and further to provide an LED module using the LED mounting substrate.

Solution to Problem

The present invention is a thermally-conductive sheet including a polymer matrix and non-spherical particles of a thermally-conductive filler that are dispersed in the polymer matrix. At least a part of the thermally-conductive filler particles are oriented in a thickness direction of the sheet. When a portion of the sheet where the thermally-conductive filler particles have the highest degree of orientation in the thickness direction of the sheet is defined as a center of orientation, and an axis passing through the center of orientation and perpendicular to sheet surfaces is defined as a central axis of orientation, the thermally-conductive sheet has a region where the thermally-conductive filler particles are oriented toward one point on the central axis of orientation and where the degree of orientation of the thermally-conductive filler particles in the thickness direction of the sheet decreases from the center of orientation toward a periphery of the sheet.

In the thermally-conductive sheet of the present invention, it is preferable that 60% or more of the thermally-conductive filler particles be oriented at an angle of 45° or more to the sheet surfaces.

In the thermally-conductive sheet of the present invention, it is preferable that a ratio $\lambda_1/\lambda_2$ be 1.5 or more, where $\lambda_1$ represents a thermal conductivity measured by applying heat to one of the sheet surfaces that is closer to the one point on the central axis of orientation and $\lambda_2$ represents a thermal conductivity measured by applying heat to the other of the sheet surfaces that is farther from the one point on the central axis of orientation.

The thermally-conductive filler is preferably carbon fiber or boron nitride.

In a preferred embodiment of the thermally-conductive sheet of the present invention, a polymer forming the polymer matrix is a polymer including, as a monomer unit, 70 mol % or more of an alkyl(meth)acrylate having an alkyl group having 2 to 14 carbon atoms. In this case, the thermally-conductive sheet can be formed as a thermally-conductive adhesive sheet.

In another preferred embodiment of the thermally-conductive sheet of the present invention, the polymer forming the polymer matrix is a fluororesin. In this case, the thermally-conductive sheet is suitable for use in a light-emitting diode mounting substrate. Therefore, the present invention is also a light-emitting diode mounting substrate including the thermally-conductive sheet. Furthermore, the present invention is also a light-emitting diode module including the light-emitting diode mounting substrate and a light-emitting diode chip.

The present invention is also a method for producing a thermally-conductive sheet, the method including the steps of coating a support with a coating liquid containing a polymer, thermally-conductive filler particles, and a solvent; applying a magnetic field from above or below the support in a radial manner to orient the thermally-conductive filler particles in the coating liquid; and drying the coating liquid on the support to obtain a sheet.

The present invention is also a method for producing a thermally-conductive sheet, the method including the steps of coating a support with a coating liquid containing a monomer, a polymerization initiator, and thermally-conductive filler particles; applying a magnetic field from above or below the support in a radial manner to orient the thermally-conductive filler particles in the coating liquid; and polymerizing the monomer in the coating liquid on the support to obtain a sheet.

Advantageous Effects of Invention

According to the present invention, it is possible to obtain a thermally-conductive sheet excellent in heat dissipation properties, the thermally-conductive sheet including a polymer matrix and thermally-conductive filler particles dispersed in the polymer matrix. According to the present invention, it is possible to configure a thermally-conductive adhesive sheet, an LED mounting substrate, an LED module and the like that are excellent in heat dissipation properties.

DESCRIPTION OF EMBODIMENTS

Figure 1:
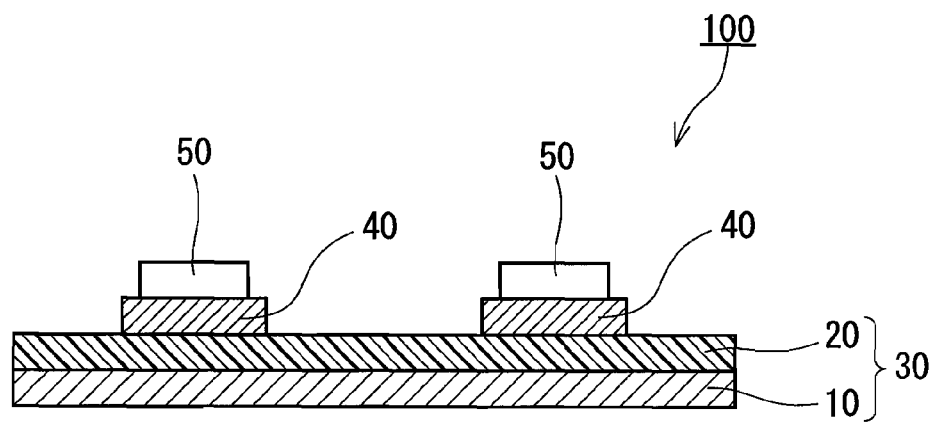
FIG. 1 is a cross-sectional view schematically showing an LED module of the present invention.

First, a thermally-conductive sheet of the present invention will be described. The present invention is a thermally-conductive sheet including a polymer matrix and non-spherical particles of a thermally-conductive filler that are dispersed in the polymer matrix. At least a part of the thermally-conductive filler particles are oriented in a thickness direction of the sheet. When a portion of the sheet where the thermally-conductive filler particles have the highest degree of orientation in the thickness direction of the sheet is defined as a center of orientation, and an axis passing through the center of orientation and perpendicular to sheet surfaces is defined as a central axis of orientation, the thermally-conductive sheet has a region where the thermally-conductive filler particles are oriented toward one point on the central axis of orientation and where the degree of orientation of the thermally-conductive filler particles in the thickness direction of the sheet decreases from the center of orientation toward a periphery of the sheet.

In the present invention, the polymer forming the matrix is not particularly limited as long as the polymer can be formed into a sheet. For example, a fluororesin, polyimide, polyarylate, polyamide-imide, polyamide, a (meth)acrylic polymer, an epoxy resin, a silicone resin, or the like, can be used.

Examples of the fluororesin include polytetrafluoroethylene, perfluoroalkoxy resins, tetrafluoroethylene-hexafluoropropylene copolymers, and polyvinylidene fluoride. When the polymer forming the matrix includes a fluororesin, the thermally-conductive sheet is suitable for use in an LED mounting substrate. Polyvinylidene fluoride is preferable as the fluororesin.

The (meth)acrylic polymer that can be suitably used is a polymer including, as a monomer unit, 70 weight % or more of an alkyl(meth)acrylate having an alkyl group having 2 to 14 carbon atoms. When the polymer forming the matrix is such a polymer, adhesiveness can be imparted to the thermally-conductive sheet. The polymer preferably includes, as a monomer unit, 80 weight % or more of an alkyl(meth)acrylate having an alkyl group having 2 to 14 carbon atoms, and more preferably includes 90 weight % or more of the alkyl(meth)acrylate.

Examples of the alkyl(meth)acrylate having an alkyl group having 2 to 14 carbon atoms include ethyl(meth)acrylate, n-propyl(meth)acrylate, isopropyl(meth)acrylate, n-butyl(meth)acrylate, sec-butyl(meth)acrylate, t-butyl(meth)acrylate, n-octyl(meth)acrylate, isooctyl(meth)acrylate, 2-ethylhexyl(meth)acrylate, isononyl(meth)acrylate, and dodecyl(meth)acrylate. One of these alkyl(meth)acrylates can be used alone or two or more thereof can be used in combination.

Examples of another monomer unit of the polymer include carboxyl group-containing monomers such as acrylic acid, methacrylic acid, carboxyethyl(meth)acrylate, carboxypentyl(meth)acrylate, itaconic acid, maleic acid, fumaric acid, and crotonic acid; hydroxyl group-containing monomers such as hydroxyethyl(meth)acrylate, hydroxypropyl(meth)acrylate, hydroxybutyl(meth)acrylate, and hydroxyhexyl(meth)acrylate; acid anhydride monomers such as maleic anhydride and itaconic anhydride; sulfonic acid group-containing monomers such as 2-acrylamido-2-methylpropanesulfonic acid and sulfopropyl acrylate; and phosphate group-containing monomers such as 2-hydroxyethylacryloyl phosphate. Examples of the other monomer unit also include: amide monomers such as (meth)acrylamide and N-substituted (meth)acrylamide as exemplified by N-methylol acrylamide; and succinimide monomers such as N-(meth)acryloyloxymethylene succinimide, N-(meth)acryloyl-6-oxyhexamethylene succinimide, and N-(meth)acryloyl-8-oxyoctamethylene succinimide. Examples of the other monomer unit further include: vinyl monomers such as vinyl acetate, N-vinyl pyrrolidone, N-vinyl carboxylic acid amides, styrene, and N-vinyl caprolactam; nitrile monomers such as acrylonitrile and methacrylonitrile; (meth)acrylic acid ester monomers such as glycidyl(meth)acrylate, tetrahydrofurfuryl(meth)acrylate, polyethylene glycol(meth)acrylate, polypropylene glycol(meth)acrylate, fluoro(meth)acrylate, silicone(meth)acrylate, and 2-methoxyethyl(meth)acrylate; and alkyl(meth)acrylates having 1 carbon atom or 15 or more carbons atoms, such as methyl(meth)acrylate and octadecyl(meth)acrylate. Among these, carboxyl group-containing monomers and hydroxyl group-containing monomers are preferable, and acrylic acid is particularly preferable, from the standpoint of the adhesiveness of the thermally-conductive sheet.

A polyfunctional (meth)acrylate may be used as the other monomer unit of the polymer. A compound having at least two (meth)acryloyl groups can be used as the polyfunctional (meth)acrylate without particular limitation. Examples of the compound include trimethylolpropane tri(meth)acrylate, pentaerythritol tetra(meth)acrylate, 1,2-ethylene glycol di(meth)acrylate, 1,6-hexanediol di(meth)acrylate, and 1,12-dodecanediol di(meth)acrylate.

The polyfunctional (meth)acrylate used is preferably mixed in such an amount that the gel fraction of the polymer matrix is 45 weight % or more, and is more preferably mixed in such an amount that the gel fraction is 50 weight % or more. When the polymer forming the matrix is the above-described polymer, the thermally-conductive sheet can function as an adhesive layer. When the gel fraction is 45 weight % or more, high cohesiveness and high holding power can be imparted to the adhesive layer, and high adhesive strength in a shear direction can be provided. However, when the gel fraction is increased too much, the tack of the adhesive layer is reduced, which may adversely affect the adhesive performance or appearance. Therefore, the gel fraction is preferably 99 weight % or less, and more preferably 97 weight % or less.

The gel fraction can be calculated by accurately weighing about 1 g of the polymer matrix, immersing the weighed polymer matrix in about 40 g of ethyl acetate for 7 days, then collecting all of the residue undissolved in the ethyl acetate, drying the collected residue at 130° C. for 2 hours, determining the weight of the dried residue, and substituting the determined value into the expression below.

Gel fraction (weight %)=(Weight of undissolved residue/Weight of polymer matrix before immersion)×100

The thermally-conductive filler particles used in the present invention have a non-spherical shape. The thermally-conductive filler particles can be oriented by virtue of being non-spherical. The shape of the thermally-conductive filler particles is preferably a plate shape or a rod shape. In the thermally-conductive filler particles, the direction of the easy axis of magnetization preferably coincides with a direction in which the thermal conductivity is high.

Examples of the thermally-conductive filler used in the present invention include carbon fibers, carbon nanotubes, metal nitrides, metal oxides, metal carbides, and metal hydroxides.

Carbon fibers obtained by using a mesophase pitch-based main raw material and performing melt spinning, insolubilization, and carbonization are more preferable than those obtained by using a PAN-based main raw material, since the carbon fibers obtained by using a mesophase pitch-based main raw material have a more developed graphite structure and show a higher thermal conductivity in the longitudinal direction of the fibers. Carbon fibers obtained by chemical vapor deposition have a reduced size, and thus are difficult to disperse and arrange in the matrix. However, the carbon fibers obtained by chemical vapor deposition are preferable since the resultant thermally-conductive sheet has a flat smooth appearance. Carbon fibers preferably have an average fiber diameter of 0.1 to 20 µm and an average fiber length of 1 to 500 µm. The upper limit of the fiber length may be determined as appropriate depending on the thickness of the thermally-conductive sheet. In view of the fact that a large aspect ratio makes the orientation difficult and that there is a limit to the fiber diameter, the length is preferably 500 µm or less.

Examples of the metal nitrides include boron nitride, aluminum nitride, and silicon nitride. Examples of the metal oxides include aluminum oxide, silicon oxide, zinc oxide, and magnesium oxide. Examples of the metal carbides include silicon carbide. Examples of the metal hydroxides include aluminum hydroxide and magnesium hydroxide. When particles of a metal nitride, a metal oxide, a metal carbide, or a metal hydroxide are used, it is advantageous that the particle diameter be 0.5 to 100 µm. When the particle diameter is less than 0.5 µm, a thermal conduction path is less likely to be formed. When the particle diameter is more than 100 µm, there is a possibility that the thermal conduction effect is reduced by an increase in the interfacial resistance due to rough surfaces or voids.

The anisotropic magnetic susceptibility of the thermally-conductive filler as determined by a suspension method is preferably $1 \times 10^{-7}$ or more. An anisotropic magnetic susceptibility smaller than $1 \times 10^{-7}$ gives rise to the need for a high magnetic field intensity or a low matrix viscosity, thereby imposes many restrictions on the facility and materials, and is thus not preferable. The suspension method is a method in which a magnetic field is applied to a solution having diamagnetic filler particles dispersed therein, the orientation relaxation time is calculated from the change in the orientation angle of the filler particles, and the anisotropic magnetic susceptibility is calculated based on the orientation relaxation time.

From the standpoint of high thermal conductivity and magnetic susceptibility, a particularly preferred thermally-conductive filler is carbon fiber or boron nitride.

The content of the thermally-conductive filler is preferably 3 to 60 weight % with respect to the polymer matrix. When the content is less than 3 weight %, there is a possibility that sufficient thermal conduction properties are not obtained. When the content is more than 60 weight %, there is a possibility that orderly arrangement of the filler particles becomes difficult.

In the thermally-conductive sheet of the present invention, at least a part of the thermally-conductive filler particles are oriented in the thickness direction of the sheet. When a portion of the sheet where the thermally-conductive filler particles have the highest degree of orientation in the thickness direction of the sheet is defined as a center of orientation, and an axis passing through the center of orientation and perpendicular to the sheet surfaces is defined as a central axis of orientation, the thermally-conductive sheet has a region where the thermally-conductive filler particles are oriented toward one point on the central axis of orientation so that the degree of orientation of the thermally-conductive filler particles in the thickness direction of the sheet decreases from the center of orientation toward the periphery of the sheet. The region where the thermally-conductive filler particles are oriented in this manner may extend over the entire sheet or may be only a part of the sheet. There may be two or more such regions in the sheet.

The degree of orientation of the thermally-conductive filler particle in the thickness direction of the sheet can be evaluated as an angle between the plane direction of the sheet and the long axis direction of the filler particle, as viewed in a cross-section in the thickness direction of the sheet.

In the thermally-conductive sheet of the present invention in which the thermally-conductive filler particles are oriented in the above-described manner, the filler particles are oriented in a fan-shaped pattern (a radial pattern), as viewed in a cross-section in the thickness direction of the sheet. In thermally-conductive sheets of conventional techniques, the filler particles are oriented along the thickness direction of the sheet, and heat can thus be transferred quickly in the thickness direction of the sheet. By contrast, the thermally-conductive filler particles in the present invention are oriented in a fan-shaped pattern (a radial pattern) in a cross-section in the thickness direction of the sheet. Therefore, when heat is applied to a part of the sheet surface toward which the fan-shaped pattern narrows (one of the sheet surfaces that is closer to the one point on the central axis of orientation), the heat can be transferred in the thickness direction of the sheet while being diffused in the plane direction of the sheet. Accordingly, the area of the sheet used for heat dissipation is increased compared to the conventional techniques in which the filler particles are oriented along the thickness direction of the sheet, and higher heat dissipation properties can be obtained.

In the thermally-conductive sheet of the present invention, it is preferable, from the standpoint of thermal conduction properties, that 60% or more of the thermally-conductive filler particles be oriented at an angle of 45° or more to the sheet surfaces.

In the present invention, the filler particles are oriented in a fan-shaped pattern (a radial pattern), as viewed in a cross-section in the thickness direction of the sheet. Therefore, when heat is applied to a part of the sheet surface toward which the fan-shaped pattern narrows (one of the sheet surfaces that is closer to the one point on the central axis of orientation), the heat is conducted in such a manner as to diffuse over the other surface of the sheet. When heat is applied to a part of the sheet surface toward which the fan-shaped pattern widens (one of the sheet surfaces that is farther from the one point on the central axis of orientation), the heat is conducted in such a manner as to converge toward the other surface of the sheet. Therefore, when a thermal conductivity measured by applying heat to the sheet surface closer to the one point on the central axis of orientation is denoted by $\lambda_1$, and a thermal conductivity measured by applying heat to the sheet surface farther from the one point on the central axis of orientation is denoted by $\lambda_2$, there is a relation of $\lambda_1 > \lambda_2$. In the present invention, the ratio $\lambda_1/\lambda_2$ between these thermal conductivities is preferably 1.5 or more.

The thickness of the thermally-conductive sheet of the present invention may be determined as appropriate depending on the intended use of the thermally-conductive sheet. When the sheet is formed as a thermally-conductive adhesive sheet, the thickness is usually 10 μm or more, preferably 20 μm or more, more preferably 30 μm or more, and usually 400 μm or less. For the use in an LED mounting substrate, the thickness is usually 50 to 300 μm, and preferably 100 to 200 μm.

The thermally-conductive sheet of the present invention may include various conventionally-known additives such as a plasticizer, a softener, a filler, a pigment, and a dye.

The production method of the thermally-conductive sheet of the present invention is not particularly limited. A suitable example of the production method is a method (method A) including: a step (coating step A) of coating a support with a coating liquid containing a polymer, thermally-conductive filler particles, and a solvent; a step (orientation step A) of applying a magnetic field from above or below the support in a radial manner to orient the thermally-conductive filler particles in the coating liquid; and a step (sheet-forming step A) of drying the coating liquid (coating film) on the support to obtain a sheet.

The method A is particularly suitable when the polymer forming the matrix is a fluororesin, polyimide, polyarylate, polyamide-imide, polyamide, an epoxy resin, a silicone resin, or the like.

First, the coating step A will be described. The coating liquid can be prepared by a commonly-known method. For example, the coating liquid can be prepared by dissolving the polymer in a solvent, and adding and dispersing the non-spherical thermally-conductive filler particles described above into the solution. The solvent may be selected as appropriate depending on the type of the polymer. A polar solvent, such as acetone, ethyl acetate, or N-methyl-2-pyrrolidone, is suitable. The solvent may be added in such an amount that the solid content concentration is about 5 to 55 weight %.

The content of the thermally-conductive filler is preferably 3 to 60 weight % with respect to the polymer.

The coating liquid may contain various additives.

A glass sheet, a polymer film, a metal plate, a metal film, or the like, can be used as the support to be coated with the coating liquid. In the case where the sheet is finally peeled off from the support, the support is preferably subjected to a release treatment.

A method using a wire bar coater, a method using an applicator, a method using a roll coater, a cast coating method, a nozzle coating method, a spray coating method, or the like, can be employed as the method for coating the support with the coating liquid.

The coating thickness is, for example, 0.001 to 0.5 mm.

Next, the orientation step A will be described. An example of the method for applying a magnetic field from above or below the support in a radial manner is a method using magnets disposed above and below the support. In this case, a magnet having a very small tip size or tip diameter may be used as one of the magnets. Even when magnets having the same tip size or tip diameter are used, a magnetic field can be concentrated by disposing a needle-shaped ferromagnetic material on one of the magnets. The magnets may be any of permanent magnets, electromagnets, and superconducting magnets.

The thermally-conductive filler particles are oriented by applying a magnetic field from above or below the support in a radial manner. The intensity of the magnetic field and the time of the application of the magnetic field may be set as appropriate depending on the desired degree of orientation of the thermally-conductive filler particles. The intensity of the magnetic field is preferably 0.5 T or more, more preferably 1 T or more, and even more preferably 2 T or more.

Next, the sheet-forming step A will be described. The sheet-forming step A can be performed by employing a commonly-known drying method appropriate for the type of the solvent. In this case, the coating film may be preliminarily dried by heating at a temperature lower than the boiling point of the solvent, simultaneously with or after the application of the magnetic field. The preliminary drying may be performed under reduced pressure. The preliminary drying is preferably carried out within a time short enough not to disturb the orientation of the thermally-conductive filler particles.

By carrying out the above steps, the thermally-conductive sheet can be obtained.

Another suitable example of the production method of the thermally-conductive sheet of the present invention is a method (method B) including: a step (coating step B) of coating a support with a coating liquid containing a monomer, a polymerization initiator, and thermally-conductive filler particles; a step (orientation step B) of applying a magnetic field from above or below the support in a radial manner to orient the thermally-conductive filler particles in the coating liquid; and a step (sheet-forming step B) of polymerizing the monomer in the coating liquid (coating film) on the support to obtain a sheet.

The method B is particularly suitable when the polymer forming the matrix is a (meth)acrylic polymer or the like.

First, the coating step B will be described. Examples of the monomer that can be used include monomers mentioned above for the polymer including, as a monomer unit, 70 weight % or more of an alkyl(meth)acrylate having an alkyl group having 2 to 14 carbon atoms. That is, the monomers mentioned as examples of the above alkyl(meth)acrylate having an alkyl group having 2 to 14 carbon atoms or examples of another monomer unit of the above polymer can be used.

As the polymerization initiator, a photopolymerization initiator, a thermal polymerization initiator, or the like, can be used. A photopolymerization initiator is preferable. Any of various photopolymerization initiators can be used without particular limitation. Examples of the polymerization initiator include: ketal-based polymerization initiators such as 2,2-dimethoxy-1,2-diphenylethan-1-one (Irgacure 651 manufactured by Ciba Specialty Chemicals); α-hydroxyketone-based polymerization initiators such as 1-hydroxy-cyclohexyl-phenyl ketone (Irgacure 184 manufactured by Ciba Specialty Chemicals), 2-hydroxy-2-methyl-1-phenyl-propan-1-one (Darocur 1173 manufactured by Ciba Specialty Chemicals), and 1-[4-(2-hydroxyethoxy)-phenyl]-2-hydroxy-2-methyl-1-propan-1-one (Irgacure 2959 manufactured by Ciba Specialty Chemicals); α-aminoketone-based polymerization initiators such as 2-methyl-1-[4-(methylthio)phenyl]-2-morpholinopropan-1-one (Irgacure 907 manufactured by Ciba Specialty Chemicals) and 2-benzyl-2-dimethylamino-1-(4-morpholinophenyl)-butanone-1 (Irgacure 369 manufactured by Ciba Specialty Chemicals); and acylphosphine oxide-based polymerization initiators such as 2,4,6-trimethylbenzoyl diphenylphosphine oxide (Lucirin TPO manufactured by BASF). Other examples include benzophenone-based, benzoin-based, and thioxanthone-based polymerization initiators.

The amount of the polymerization initiator used is preferably 0.001 to 5 parts by weight, more preferably 0.01 to 4 parts by weight, and even more preferably 0.1 to 3 parts by weight, per 100 parts by weight of the monomer.

The coating liquid can be prepared by a commonly-known method. For example, the coating liquid can be prepared by dissolving the above polymerization initiator in a monomer, and adding and dispersing the non-spherical thermally-conductive filler particles described above into the solution. The viscosity of the coating liquid is not particularly limited. The viscosity is preferably 0.1 to 10 Pa·s at 25° C., in terms of ease of coating and ease of dispersion and orientation of the thermally-conductive filler particles. When the viscosity is less than 0.1 Pa·s, there is a possibility that the filler particles are sedimented or the coating film has an uneven thickness. On the other hand, when the viscosity is more than 10 Pa·s, there is a possibility that the degree of orientation of the filler particles is insufficient and that air bubbles are more likely to be entrapped in the coating film.

In order to adjust the viscosity of the coating liquid, a part of the monomer may be preliminarily polymerized before mixing into the coating liquid. That is, the monomer may be mixed into the coating liquid in the form of a partially-polymerized product. Although depending on the polymer molecular weight in the partially-polymerized product, the polymerization ratio of the partially-polymerized product is preferably 2 to 40 weight %, and more preferably 5 to 20 weight %. When partial polymerization is carried out, it is preferable to perform ultraviolet irradiation while avoiding contact with oxygen. The polymerization ratio of the partially-polymerized product can be calculated by accurately weighing about 0.5 g of the partially-polymerized product, drying the weighed partially-polymerized product at 130° C. for 2 hours, accurately determining the weight of the dried product, and substituting the determined value into the expression below.

Polymerization ratio (%) of partially-polymerized product=(Weight of partially-polymerized product after drying/Weight of partially-polymerized product before drying)×100

Alternatively, the viscosity of the coating liquid can be adjusted by mixing a thickening polymer into the coating liquid as appropriate. Polymers that can be used as the thickening polymer include: acrylic polymers resulting from copolymerization of the above-described alkyl(meth)acrylate having an alkyl group having 2 to 14 carbon atoms with acrylic acid, acrylamide, acrylonitrile, acryloylmorpholine, and the like; styrene-butadiene rubber (SBR); ethylene-vinyl acetate copolymers; acrylic rubber; polyurethanes; and polyesters. The polymer serving as a thickener is used in an amount of 40 weight % or less with respect to the total amount of the monomer, the polymer serving as a thickener, and the polymerization initiator. When a thickening polymer is used, 5 weight % or more of the thickening polymer is preferably used.

The content of the thermally-conductive filler is preferably 3 to 60 weight % with respect to the monomer.

The coating liquid may contain various additives.

A glass sheet, a polymer film, a metal plate, a metal film, or the like, can be used as the support to be coated with the coating liquid.

A method using a wire bar coater, a method using an applicator, a method using a roll coater, a cast coating method, a nozzle coating method, a spray coating method, or the like, can be employed as the method for coating the support with the coating liquid.

The coating thickness is, for example, 0.001 to 0.5 mm.

The orientation step B can be carried out in the same manner as the orientation step A.

In the case where a thermal polymerization initiator is mixed into the coating liquid, the sheet-forming step can be performed by heating the coating film to polymerize the monomer. In the case where a photopolymerization initiator is mixed into the coating liquid, the sheet-forming step can be performed by irradiating the coating film with light such as ultraviolet light to polymerize the monomer. Specifically, the light irradiation is performed, for example, with 400 to 4000 mJ/cm$^2$ of ultraviolet light having an intensity of 1 to 200 mW/cm$^2$ at a wavelength of 300 to 400 nm. In this case, the polymerization ratio is desirably 90 weight % or more. The polymerization ratio can be calculated by the same method as described above.

After the monomer is polymerized, hot-air drying, vacuum drying, reduced-pressure drying, far-infrared radiation drying, or the like, may be performed to remove the remaining monomer.

By carrying out the above steps, the thermally-conductive sheet can be obtained.

Alternatively, the thermally-conductive sheet of the present invention can be produced also by coating a support with the coating liquid used in the method B, then applying a magnetic field to orient the thermally-conductive filler particles along the thickness direction, and irradiating a part of the surface of the coating film with light to cause cure shrinkage inhomogeneously.

The thermally-conductive sheet of the present invention is excellent in heat dissipation properties. In the thermally-conductive sheet of the present invention, the filler particles are oriented in a fan-shaped pattern (a radial pattern), as viewed in a cross-section in the thickness direction of the sheet. Therefore, when heat is applied to a part of the sheet surface toward which the fan-shaped pattern narrows (the sheet surface (defined as a $\lambda_1$ surface) closer to the one point on the central axis of orientation), the heat is conducted in such a manner as to diffuse over the other surface of the sheet. When heat is applied to a part of the sheet surface toward which the fan-shaped pattern widens (the sheet surface (defined as a $\lambda_2$ surface) farther from the one point on the central axis of orientation), the heat is conducted in such a manner as to converge toward the other surface of the sheet. Therefore, in the case where importance is placed on heat dissipation, it is effective to use the $\lambda_1$ surface on the side where a heat-generating component is located. In this case, the heat-generating component is preferably positioned on the center of orientation. On the other hand, in the case where it is intended to avoid applying heat to a component adjacent to a heat-generating component, local heat dissipation may be achieved by using the $\lambda_2$ surface on the side where the heat-generating component is located or by using a plurality of the thermally-conductive sheets so as to dispose the combination of the $\lambda_1$ surface and the $\lambda_2$ surface on the side where the heat-generating component is located.

In a suitable embodiment of the thermally-conductive sheet of the present invention, a (meth)acrylic polymer, particularly a polymer including as a monomer unit 70 weight % or more of an alkyl(meth)acrylate having an alkyl group having 2 to 14 carbon atoms, is used as the polymer forming the matrix, and the thermally-conductive sheet is formed as a thermally-conductive adhesive sheet.

The thermally-conductive adhesive sheet can be used according to an ordinary method, and can be used, for example, by being interposed between a heat-generating component and a heat sink, a heat spreader, or the like.

In another suitable embodiment of the thermally-conductive sheet of the present invention, a fluororesin, particularly vinylidene fluoride, is used as the polymer forming the matrix, and the thermally-conductive sheet is used in an LED mounting substrate. For example, the LED mounting substrate has a configuration in which a layer of a metal such as copper or aluminum and the thermally-conductive sheet are stacked together.

An LED module can be configured by using the LED mounting substrate and an LED chip according to an ordinary method. An example of the configuration of the LED module is shown in FIG. 1. An LED module 100 includes: an LED mounting substrate 30 composed of a stack of an aluminum frame 10 and a thermally-conductive sheet 20; a copper film 40; and an LED chip 50. The LED mounting substrate 30 is a flexible substrate since the aluminum frame 10 and the thermally-conductive sheet 20 have flexibility. Therefore, the LED module 100 has a structure in which the LED chip 50 is mounted on a flexible substrate.

EXAMPLES

Hereinafter, the present invention will be described in detail with reference to examples and comparative examples. However, the present invention is not limited to these examples. First, evaluation methods will be described.

<Thermal Conductivity Measurement>

The thermal diffusivity of each of the obtained thermally-conductive sheets was measured by a xenon flash analyzer (manufactured by NETZCHE). Specifically, xenon flash was applied to the lower surface of the sample sheet in the thickness direction of the sheet, infrared light radiated from the sample was detected by a detector, a thermal diffusion coefficient α was derived from a time (t½) taken for the upper surface of the sample to achieve a temperature increase corresponding to ½ of the maximum temperature increase (Δt-max), and the thermal conductivity of the sample was calculated by the expression (1).

$$\lambda = \alpha \cdot Cp \cdot \rho \quad \text{Expression (1)}$$

λ: Thermal conductivity (W/m·K)
α: Thermal diffusion coefficient (m²/s)
Cp: Specific heat (J/kg·K)
ρ: Specific gravity (kg/m³)

<Orientation Angle Measurement>

Serial radiographs were taken by X-ray CT (SKYSCAN, 1172 MicroCT, tube voltage of 25 lv, tube current of 140 μA), and a cross-sectional image was created. The obtained three-dimensional image was subjected to binarization, and the orientation angles of the filler particles were determined. The orientation angle of 0° was defined to correspond to the plane direction of the film.

<Adhesive Force Measurement>

The adhesive film was sandwiched between and adhered to a SUS and a polyimide film. Thereafter, the resulting structure was slit into a 10-mm wide strip. The measurement value obtained in a 180° peel test performed at a tensile rate of 50 mm/min using Autograph (AG-1 manufactured by Shimadzu Corporation) was determined as an adhesive force.

Example 1

Figure 2:
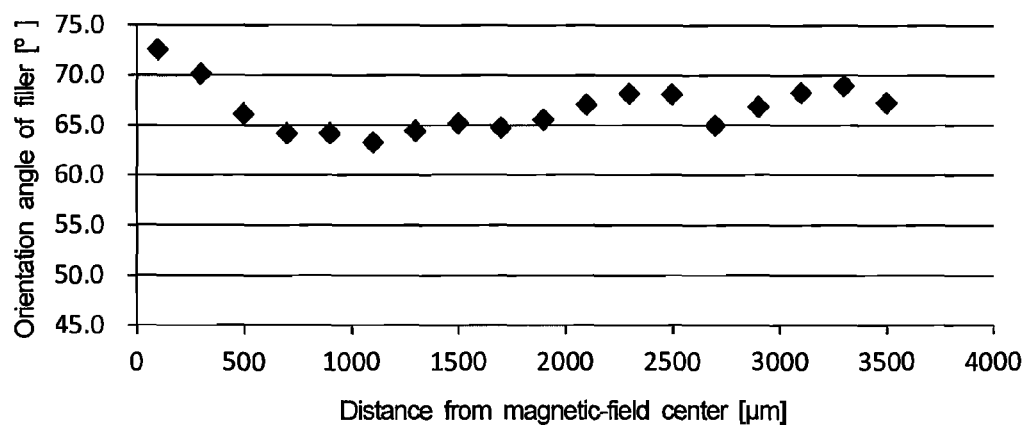
FIG. 2 shows a result of orientation angle measurement performed on a thermally-conductive sheet of Example 1 by X-ray CT.

A monomer mixture of 90 parts by weight of 2-ethylhexyl acrylate and 10 parts by weight of acrylic acid was prepared as a monomer component, with which 0.1 parts by weight of a photopolymerization initiator, trade name "Irgacure 651" (manufactured by Ciba Specialty Chemicals), was mixed and blended. Thereafter, the resulting mixture was put into a flask, and exposed to ultraviolet radiation from a black light in a nitrogen atmosphere so as to cause partial photopolymerization. Thus, a partially-polymerized monomer composition (photopolymerizable syrup) having a polymerization ratio of 7% was prepared. Carbon fibers (Raheama manufactured by TEIJIN LIMITED.) were added to the photopolymerizable syrup in an amount of 10 wt %, and were then dispersed with a planetary centrifugal mixer to obtain a coating liquid. A separator was coated with the coating liquid to a thickness of 100 μm, and another separator was placed on the coating film to block air. The three-layer base was inserted in a magnetic-field space, and a magnetic field of 2 T was applied in a radial manner for 5 minutes. In the upper part of the magnetic-field space, an iron wire was set at the center of the magnetic-field space so as to be perpendicular to the film, and the distance between the tip of the wire and the surface of the film was set to 2 mm. After the magnetic field application, UV irradiation was performed for 10 minutes to polymerize the monomer component. Subsequently, one of the separators was peeled off, and drying was performed at 130° C. for 3 minutes to remove the remaining monomer. As a result, an orientation state was obtained in which the orientation degree of the carbon fibers decreased from the center that is in the vicinity of the wire toward the periphery of the sheet. The result of the orientation angle measurement is shown in FIG. 2. By the measurement of the orientation angles of the filler particles, it was found that the carbon fibers oriented at an angle of 45° or more to the sheet surfaces accounted for 87% of all the carbon fibers. By the measurement of the thermal conductivities ($\lambda_1$ and $\lambda_2$ defined in the present specification), it was found that $\lambda_1$ was 1.2 W/mK, $\lambda_2$ was 0.6 W/mK, and $\lambda_1/\lambda_2$ was 2. The adhesive force between the sheet and the SUS was 4.2 N/10 mm, which was sufficient for practical use.

Example 2

Figure 3:
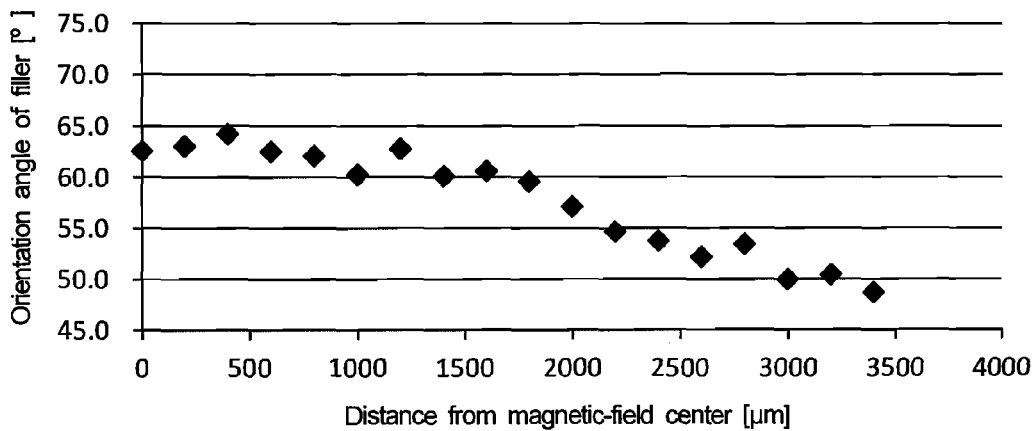
FIG. 3 shows a result of orientation angle measurement performed on a thermally-conductive sheet of Example 2 by X-ray CT.

The same procedures as in Example 1 were carried out, except that the carbon fibers were replaced by boron nitride particles (plate-shaped particles, PT 110 manufactured by Momentive Performance Materials Inc.). As a result, an orientation state was obtained in which the orientation degree of the boron nitride particles decreased from the center that is in the vicinity of the wire toward the periphery of the sheet. The result of the orientation angle measurement is shown in FIG. 3. By the measurement of the thermal conductivities, it was found that $\lambda_1$ was 0.4 W/mK, $\lambda_2$ was 0.14 W/mK, and $\lambda_1/\lambda_2$ was 2.8. Furthermore, the adhesive force between the sheet and the SUS was 5.8 N/10 mm, which was sufficient for practical use.

Example 3

A polyvinylidene fluoride (PVdF) powder (#1100 manufactured by Kureha Chemical Industries, Co., Ltd.) was dissolved in dimethylacetamide (so that the solid content concentration was 18 weight %). Boron nitride particles (HGP grade manufactured by Denki Kagaku Kogyo K.K.) were mixed into the PVdF solution in an amount of 35 volume % with respect to the solid content of PVdF, and thus a coating liquid was obtained. After a glass sheet was coated with this coating liquid, the resulting sheet was inserted in a magnetic-field space, and was heated at 25° C. for 10 minutes and at 90° C. for 10 minutes while a magnetic field of 2 T was applied in a radial manner. In the upper part of the magnetic-field space, an iron wire was set at the center of the magnetic-field space so as to be perpendicular to the coating film, and the distance between the tip of the wire and the surface of the coating film was set to 2 mm. The sheet was taken out of the magnetic-field space, and was then heated at 120° C. for 30 minutes and at 200° C. for 10 minutes. As a result, an orientation state was obtained in which the orientation degree of the boron nitride particles decreased from the center that is in the vicinity of the wire toward the periphery of the sheet. The thickness of the sheet was 70 μm. By the measurement of the thermal conductivities, it was found that $\lambda_1$ was 2.4 W/mK, $\lambda_2$ was 1.5 W/mK, and $\lambda_1/\lambda_2$ was 1.6. Furthermore, the UV reflectance (at 460 nm) was 81% as measured by an ordinary method.

Comparative Example 1

The same procedures as in Example 1 were carried out, except that in the application of magnetic field, a magnetic field was applied in a direction perpendicular to the sheet with no wire provided. As a result, the carbon fibers in the sheet were perpendicularly-oriented almost uniformly. By the measurement of the thermal conductivity, it was found that λ was 0.7 W/mK.

Comparative Example 2

The same procedures as in Example 2 were carried out, except that in the application of magnetic field, a magnetic field was applied in a direction perpendicular to the sheet with no wire provided. As a result, the boron nitride particles in the sheet were perpendicularly-oriented almost uniformly. By the measurement of the thermal conductivity, it was found that λ was 0.25 W/mK.

Comparative Example 3

The same procedures as in Example 3 were carried out, except that in the application of magnetic field, a magnetic field was applied in a direction perpendicular to the sheet with no wire provided. As a result, the boron nitride particles in the sheet were perpendicularly-oriented almost uniformly. By the measurement of the thermal conductivity, it was found that λ was 1.9 W/mK. In addition, the UV reflectance (at 460 nm) was 76% as measured by an ordinary method.

INDUSTRIAL APPLICABILITY

The thermally-conductive sheet of the present invention can be used for the purpose of heat dissipation of a heat-generating component.

The invention claimed is:

1. A thermally-conductive sheet comprising a polymer matrix and non-spherical particles of a thermally-conductive filler that are dispersed in the polymer matrix, wherein
    at least a part of the thermally-conductive filler particles are oriented in a thickness direction of the sheet,
    wherein a portion of the sheet where the thermally-conductive filler particles have the highest degree of orientation in the thickness direction of the sheet is defined as a center of orientation, and an axis passing through the center of orientation and perpendicular to sheet surfaces is defined as a central axis of orientation, the thermally-conductive sheet has a region where the thermally-conductive filler particles are oriented toward one point on the central axis of orientation and where the degree of orientation of the thermally-conductive filler particles in the thickness direction of the sheet decreases from the center of orientation toward a periphery of the sheet,
    60% or more of the thermally conductive filler particles are oriented at an angle of 45° or more relative to the sheet surfaces, and
    a ratio λ1/λ2 is 1.5 or more, where λ1 represents a thermal conductivity measured by applying heat to one of the sheet surfaces that is closer to the one point on the central axis of orientation and λ2 represents a thermal conductivity measured by applying heat to the other of the sheet surfaces that is farther from the one point on the central axis of orientation.

2. The thermally-conductive sheet according to claim 1, wherein the thermally-conductive filler is carbon fiber or boron nitride.

3. The thermally-conductive sheet according to claim 1, wherein a polymer forming the polymer matrix is a polymer including, as a monomer unit, 70 mol % or more of an alkyl (meth)acrylate having an alkyl group having 2 to 14 carbon atoms.

4. The thermally-conductive sheet according to claim 3, wherein the thermally-conductive sheet is a thermally-conductive adhesive sheet.

5. The thermally-conductive sheet according to claim 1, wherein a polymer forming the polymer matrix is a fluororesin.

6. A light-emitting diode mounting substrate comprising the thermally-conductive sheet according to claim 5.

7. A light-emitting diode module comprising the light-emitting diode mounting substrate according to claim 6 and a light-emitting diode chip.

8. A method for producing the thermally-conductive sheet according to claim 1, comprising the steps of:
    coating a support with a coating liquid containing a polymer, thermally-conductive filler particles, and a solvent;
    applying a magnetic field from above or below the support in a radial manner to orient the thermally-conductive filler particles in the coating liquid; and
    drying the coating liquid on the support to obtain a sheet.

9. A method for producing the thermally-conductive sheet according to claim 1, comprising the steps of:
    coating a support with a coating liquid containing a monomer, a polymerization initiator, and thermally-conductive filler particles;
    applying a magnetic field from above or below the support in a radial manner to orient the thermally-conductive filler particles in the coating liquid; and
    polymerizing the monomer in the coating liquid on the support to obtain a sheet.

* * * * *